(12) United States Patent
Iwaki et al.

(10) Patent No.: US 7,755,453 B2
(45) Date of Patent: Jul. 13, 2010

(54) DUPLEXER

(75) Inventors: Masafumi Iwaki, Kawasaki (JP); Tokihiro Nishihara, Kawasaki (JP); Masanori Ueda, Kawasaki (JP); Go Endo, Yokohama (JP)

(73) Assignees: Fujitsu Media Devices Limited, Yokohama (JP); Taiyo Yuden Co., Ltd., Tokyo (JP)

( * ) Notice: Subject to any disclaimer, the term of this patent is extended or adjusted under 35 U.S.C. 154(b) by 234 days.

(21) Appl. No.: 11/812,514

(22) Filed: Jun. 19, 2007

(65) Prior Publication Data
US 2008/0024243 A1 Jan. 31, 2008

(30) Foreign Application Priority Data
Jun. 19, 2006 (JP) .............................. 2006-169274

(51) Int. Cl.
*H03H 9/00* (2006.01)
*H03H 9/64* (2006.01)

(52) U.S. Cl. ...................... 333/133; 333/189; 333/193

(58) Field of Classification Search ................ 333/133, 333/187, 188, 189, 190, 191, 192, 193, 194, 333/195, 196
See application file for complete search history.

(56) References Cited

U.S. PATENT DOCUMENTS 5,880,649 A * 3/1999 Tai et al. ...................... 333/132
6,222,426 B1 * 4/2001 Komazaki et al. ............ 333/133
7,057,472 B2 * 6/2006 Fukamachi et al. .......... 333/101
7,212,080 B2 * 5/2007 Mimura et al. ............... 333/133
7,253,702 B2 * 8/2007 Kemmochi et al. .......... 333/133
7,332,986 B2 * 2/2008 Koga et al. ................... 333/193

FOREIGN PATENT DOCUMENTS

| JP | 10-313229 A | 11/1998 |
| JP | 2003-332885 A | 11/2003 |
| WO | WO 2005088836 A1 * | 9/2005 |

* cited by examiner

*Primary Examiner*—Dean O Takaoka
(74) *Attorney, Agent, or Firm*—Arent Fox LLP

(57) ABSTRACT

A duplexer includes an antenna terminal, a first filter connected to the antenna terminal, a second filter that has a passband at a high-frequency side of the first filter and is connected to the antenna terminal, and a resonance circuit that is connected between the second filter and the antenna terminal and includes a first inductor and a first capacitor connected in parallel. Assuming that a passband frequency of the first filter ranges from $f_{1Low}$ to $f_{1High}$ ($f_{1Low}$~$f_{1High}$) and a passband frequency ranges from $f_{2Low}$ to $f_{2High}$ ($f_{2Low}$~$f_{2High}$), the resonator has a resonance frequency $f_r$ satisfying:

$$f_r = (f_{2Low} \sim f_{2High}) \pm (f_{1Low} \sim f_{1High}),$$

or $$f_r = 2(f_{1Low} \sim f_{1High}) \pm (f_{2Low} \sim f_{2High}).$$

10 Claims, 21 Drawing Sheets

—— EMBODIMENT
- - - - COMPARATIVE EXAMPLE

——— EMBODIMENT
········· COMPARATIVE EXAMPLE

Fig. 10A
Fig. 10B
INTENSITY OF TX SIGNAL: A1
INTENSITY OF DISTURBANCE WAVE: A2
(a) WHEN FREQUENCIES OF DISTURBANCE WAVE ARE f2+f1, f2-f1, IMD level ∝ A1 · A2
(b) WHEN FREQUENCIES OF DISTURBANCE WAVE ARE 2f1+f2, 2f1-f2, IMD level ∝ $A1^2$ · A2
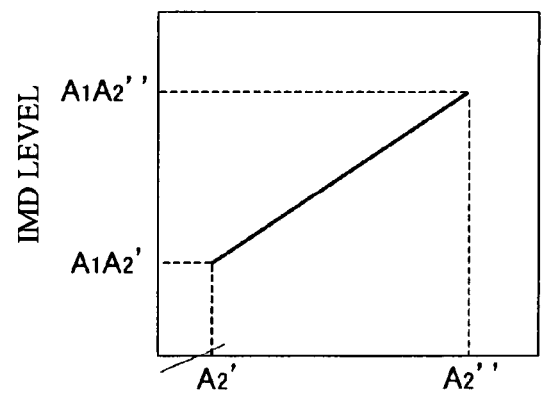
INTENSITY OF DISTURBANCE WAVE (A2)
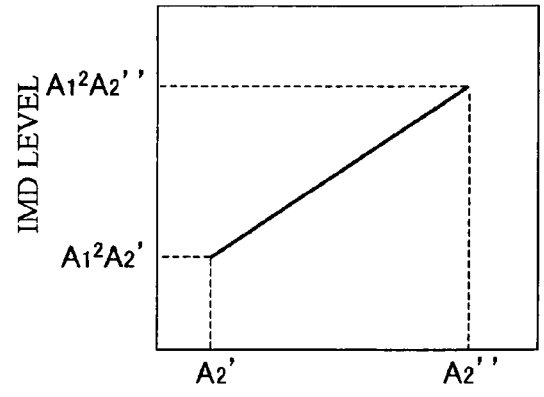
INTENSITY OF DISTURBANCE WAVE (A2)

DUPLEXER

BACKGROUND OF THE INVENTION

1. Field of the Invention

This invention generally relates to duplexers, and more particularly, to a duplexer having a resonance circuit connected to an antenna terminal.

2. Description of the Related Art

A filter for high-frequency communications is available. Generally, such a filter is composed of multiple resonators and is capable of allowing only electric signals in a particular frequency range to pass. The resonators may use a piezoelectric material and utilize a surface acoustic wave (SAW) or a bulk acoustic wave (BAW). The filter devices that utilize SAW or BAW have a compact outer size and a sharp roll-off characteristic, as compared to dielectric filters and ceramic filters. Thus, the SAW or BAW filter devices are suitable for mobile communication devices of portable telephones required to have a compact size and a small ratio of the signal bandwidth to the center frequency. A duplexer is a device to which the SAW or BAW filters are applied. The duplexer is employed in radio frequency communication equipment capable of transmitting and receiving signals at different frequencies. The SAW or BAW filter may be formed by arranging resonators in a ladder configuration. The insertion loss and out-of-band rejection of the ladder type filter may be easily adjusted by simply changing the number of stages of the ladder configuration and the capacitance ratio between the series and parallel resonators. Further, the design sequence is simple. For the above-mentioned reasons, the ladder type filters are widely used.

Japanese Patent Application Publication No. 2003-332885 discloses a duplexer composed of first and second filters and a matching circuit, in which inductors are connected to series resonators of the first and second filters (see FIG. 1). Japanese Patent Application Publication No. 10-313229 discloses a duplexer composed of first and second filters and a matching circuit in which an inductor that forms the matching circuit is connected between an antenna terminal and ground.

The duplexer used in mobile communications or high frequency wireless communications should be designed to consider IMD (Inter Modulation Distortion) and CMD (Cross Modulation Distortion). These adverse factors arise from the non-linearity of the structure and material of the resonators. When two or more signals of different frequencies (which may, for example, a transmission signal and a disturbance wave) are applied to the duplexer, the non-linearity of the duplexer may result in a signal of a reception frequency capable of passing through the reception system of the duplexer. The signal passing through the reception system is noise.

SUMMARY OF THE INVENTION

The present invention has been made in view of the above circumstances and provides a duplexer capable of suppressing non-linearity.

According to an aspect of the present invention, there is provided a duplexer including: an antenna terminal; a first filter connected to the antenna terminal; a second filter that has a passband at a high-frequency side of the first filter and is connected to the antenna terminal; and a resonance circuit that is connected between the second filter and the antenna terminal and includes a first inductor and a first capacitor connected in parallel; assuming that a passband frequency of the first filter ranges from $f_{1Low}$ to $f_{1High}$ ($f_{1Low} \sim f_{1High}$) and a passband frequency ranges from $f_{2Low}$ to $f_{2High}$ ($f_{2Low} \sim f_{2High}$), the resonator having a resonance frequency $f_r$ satisfying: $f_r = (f_{2Low} \sim f_{2High}) \pm (f_{1Low} \sim f_{1High})$, or $f_r = 2(f_{1Low} \sim f_{1High}) \pm (f_{2Low} \sim f_{2High})$.

According to another aspect of the present invention, there is provided a duplexer including: an antenna terminal; a first filter connected to the antenna terminal; a second filter that has a passband at a high-frequency side of the first filter and is connected to the antenna terminal; and a resonance circuit that is connected between the second filter and the antenna terminal and includes a first inductor and a first capacitor connected in parallel; assuming that a passband frequency of the first filter ranges from $f_{1Low}$ to $f_{1High}$ ($f_{1Low} \sim f_{1High}$) and a passband frequency ranges from $f_{2Low}$ to $f_{2High}$ ($f_{2Low} \sim f_{2High}$), the resonator having a resonance frequency $f_r$ satisfying:

$$f_r = 2(f_{1Low} \sim f_{1High}), f_r = 2(f_{2Low} \sim f_{2High}), f_r = 3(f_{1Low} \sim f_{1High}), \text{ or } f_r = 3(f_{2Low} \sim f_{2High}).$$

BRIEF DESCRIPTION OF THE DRAWINGS

Embodiments of the present invention will be described with reference to the accompanying drawings, in which:

FIG. 10A show the intensity of a disturbance wave and an inter modulation distortion level when the disturbance wave has a frequency of $f_2 \pm f_1$;

FIG. 10B show the intensity of a disturbance wave and an inter modulation distortion level when the disturbance wave has a frequency of $2f_1 \pm f_2$;

DESCRIPTION OF THE PREFERRED EMBODIMENTS

A description will now be given of embodiments of the present invention with reference to the accompanying drawings.

First Embodiment

Figure 1:
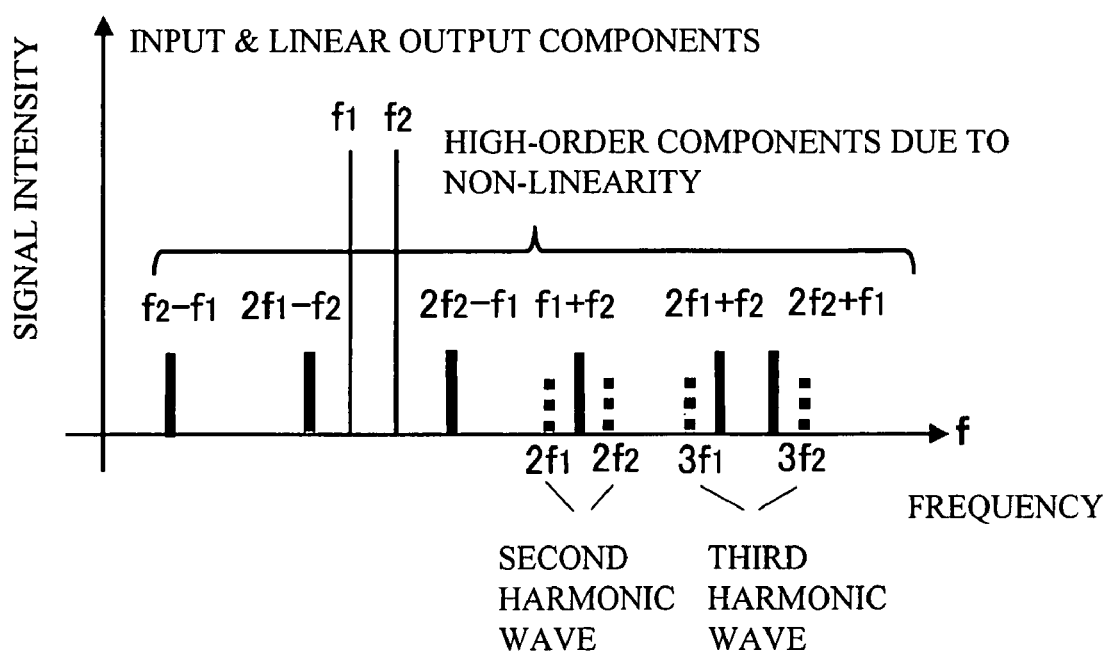
FIG. 1 shows high-order components due to non-linearity.

FIG. 1 shows high-order harmonic components due to non-linearity. The horizontal axis of FIG. 1 denotes the frequency and the vertical axis denotes the signal intensity of frequency components. In a case where two signals of frequency f1 and f2, $x = A_1 \cos(2\pi f_1 \cdot t), A_2 \cos(2\pi f_2 \cdot t)$ are input to an element, if this element has good linearity, the output signal y of the element is described as follows:

$$y = ax = a\{A_1 \cos(2\pi f_1 \cdot t) + A_2 \cos(2\pi f_2 \cdot t)\}$$

where $A_1$ and $A_2$ respectively denote the intensities of the signals of $f_1$ and $f_2$, a is a constant, and t is time.

If the element does not have good linearity, the output thereof will have second-order and third-order components, as described below:

$$\begin{aligned}y = {}& ax + bx^2 + cx^3 + \ldots \\= {}& a\{A_1 \cos(2\pi f_1 \cdot t) + A_2 \cos(2\pi f_2 \cdot t)\} + \\& b\{A_1 \cos(2\pi f_1 \cdot t) + A_2 \cos(2\pi f_2 \cdot t)\}^2 + \\& c\{A_1 \cos(2\pi f_1 \cdot t) + A_2 \cos(2\pi f_2 \cdot t)\}^3 + \ldots\end{aligned} \quad (1)$$

When the items of the third order are considered, the output y is described as follows:

$$\begin{aligned}y = {}& A_0 + \{B_1 \cos(2\pi f_1 \cdot t) + B_2 \cos(2\pi f_2 \cdot t)\} + \{C_1 \cos(2\pi 2f_1 \cdot t) + C_2 \cos(2\pi 2f_2 \cdot t)\} + \{D_1 \cos(2\pi(3f_1) \cdot t) + D_2 \cos(2\pi(3f_2) \cdot t)\} + \{E_1 \cos(2\pi(f_1 - f_2) \cdot t) + E_2 \cos(2\pi(f_1 + f_2) \cdot t)\} + \{F_1 \cos(2\pi(2f_1 - f_2) \cdot t) + F_2 \cos(2\pi(2f_1 + f_2) \cdot t)\} + \{G_1 \cos(2\pi(f_1 - 2f_2) \cdot t) + G_2 \cos(2\pi(f_1 + 2f_2) \cdot t)\}\end{aligned} \quad (2)$$

where:

$A_0 = (b/2)A_1^2 + (b/2)A_2^2$ $B_1 = aA_1 + (3/4)cA_1^3 + (2/3)cA_1A_2^2$ $B_2 = aA_2 + (3/4)cA_2^3 + (2/3)cA_2A_1^2$ $C_1 = (b/2)A_1^2, C_2 = (b/2)A_2^2$ $D_1 = (c/4)A_1^3, D_2 = (c/4)A_2^3$ $E_1 = E_2 = bA_1A_2, F_1 = F_2 = (3/2)cA_1^2A_2, G_1 = G_2 = (3/2)cA_1A_2^2$

Thus, it can be seen from Expression (2) that the case shown in FIG. 1 has non-linear harmonic components of $2f_1$, $2f_2$, $3f_1$, $3f_2$, $f_2 - f_1$, $f_1 + f_2$, $2f_1 - f_2$, $2f_1 + f_2$, $f_1 - 2f_2$, $f_2 + 2f_2$.

Figure 2:
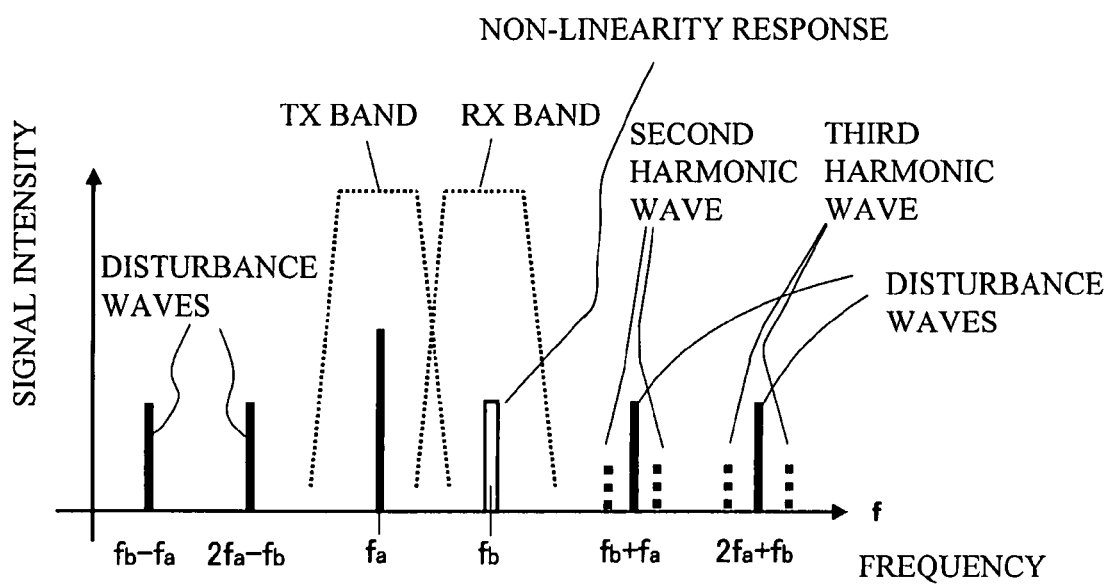
FIG. 2 shows a case where a disturbance wave is input to a duplexer.

FIG. 2 supposes a duplexer. Assuming that $f_a$ and $f_b$ respectively denote the transmission and reception frequencies, when the antenna receives a signal of $f_b - f_a$, $f_b + f_a$, $2f_a - f_b$ or $2f_a + f_b$ at the same time when receiving the signal of $f_a$, the non-linearity between these signals and the transmission signal of $f_a$ will result in a signal of $f_b$. That is, the signal having the same frequency as the frequency $f_b$ of the reception signal is developed, and becomes noise. Signals of $f_b \pm f_a$ and $2f_a \pm f_b$ are called disturbance waves. Further, second and third overtone waves of the transmission and reception frequencies are generated close to the disturbance waves of $f_b \pm f_a$ and $2f_a \pm f_b$. The frequencies of the second and third overtone waves are close to the frequencies of the disturbance waves, and cause non-linear noise in the reception frequency.

Figure 3:
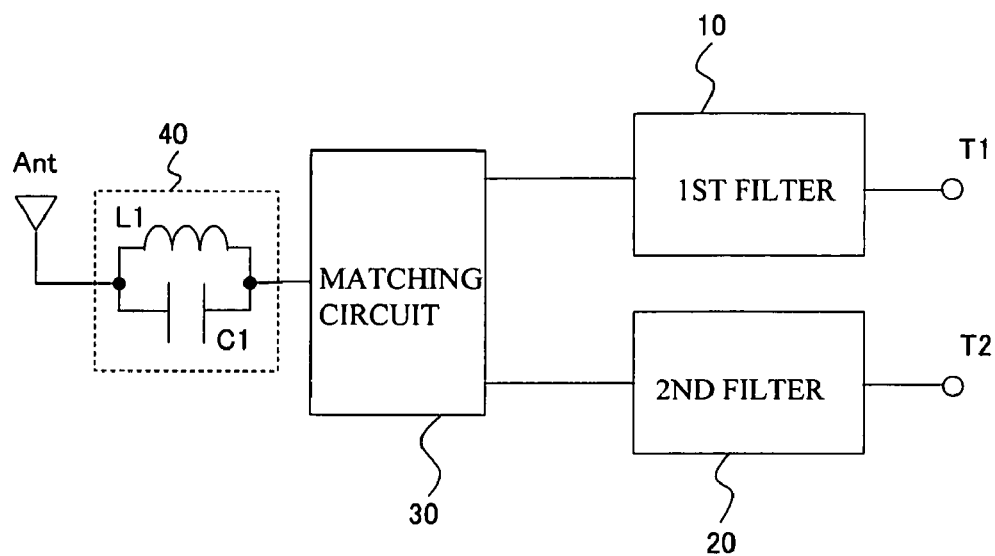
FIG. 3 is a block diagram of a duplexer in accordance with a first embodiment.

The first embodiment aims at restraining the disturbance waves or the second and third overtone waves. FIG. 3 is a block diagram of a duplexer in accordance with a first embodiment. The first embodiment is suitably used for W-CDMA (Wide Band Code Division Multiple Access). The duplexer includes a first filter 10, a second filter 20, a matching circuit 30 and a resonance circuit 40. The first filter 10 may be a transmission filter having a transmission band of 1920 MHz to 1980 MHz, and the second filter 20 may be a reception filter having a reception band of 2110 MHz to 2170 MHz. The first filter 10 is provided between an antenna terminal Ant and a first terminal T1, and the second filter 20 is provided between the antenna terminal Ant and a second terminal T2. The pass band of the second filter is higher than that of the first filter, or is located at a high frequency side of the second filter. The matching circuit 30 and the resonance circuit 40 are provided between the antenna terminal Ant and the first and second filters 10 and 20. The resonance circuit 40 includes a first inductor L1 and a first capacitor C1 connected in parallel and provided between the antenna terminal Ant and the matching circuit 30.

Generally, as in the case of the first embodiment, the first filter 10 having the comparatively low frequency pass band is assigned to the transmission filter, and the second filter 20 having the comparatively high frequency pass band is assigned to the reception filter. The matching circuit 30 functions as follows. The matching circuit 30 causes the impedance of the second filter 20 viewed from the antenna terminal Ant to be as great as possible in the transmission band. It is thus possible to prevent power of the transmission signal that is input via the first terminal T1 to enter into the second filter 20. The resonance circuit 40 is designed to have the resonance frequency equal to the frequency of the disturbance wave. It is thus possible to prevent the disturbance entering into the antenna terminal from reaching the second filter 20.

Figure 4:
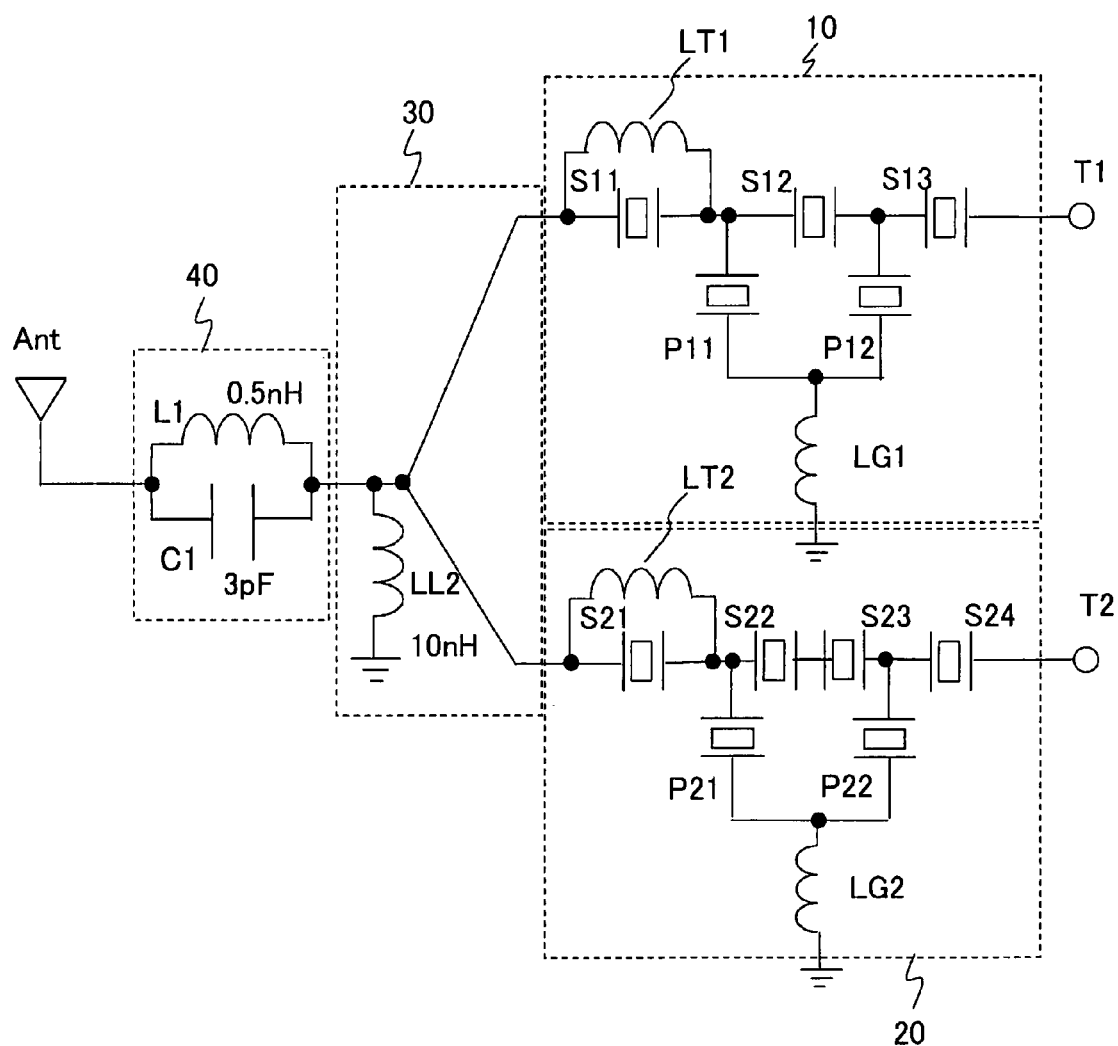
FIG. 4 is an equivalent circuit of the duplexer in accordance with the first embodiment.

FIG. 4 shows an equivalent circuit of the first embodiment. The first filter 10 is a ladder type filter composed of series resonators S11, S12 and S13 and parallel resonators P11 and P12. A third inductor LT1 is connected in parallel with the series resonator S11 closest to the antenna terminal Ant, and a fourth inductor LG1 is connected between a common node of the parallel resonators P11 and P12 and ground. The second resonator 20 is a ladder type filter composed of series resonators S21, S22, S23 and S24 and parallel resonators P21 and P22. A third inductor LT2 is connected in parallel with the series resonator S21 closest to the antenna terminal Ant, and a fourth inductor LG2 is connected between a common node of the parallel resonators P21 and P22 and ground LG2. The matching circuit 30 includes an inductor LL2 between a common node of the first filter 10 and the second filter 20 and ground. For example, the inductor LL2 has an inductance of 10 nH. The resonance circuit 40 is composed of the first capacitor C1 having a capacitance of, for example, 3 pF and the first inductor L1 having an inductance of, for example, 0.5 nH. The resonance circuit has a resonance frequency of, for example, 4109 MHz. This corresponds to a frequency in the range of 4030 to 4150 MHz that is a disturbance wave $f_a+f_b$ where $f_a$ and $f_b$ are the transmission and reception bands, respectively. The resonance circuit 40 increases the impedance at frequencies equal to or close to 4109 MHz and blocks these frequencies.

Figure 5A:
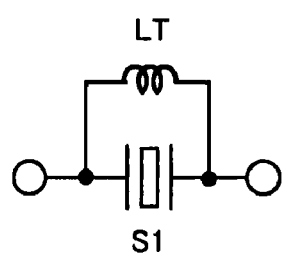
FIG. 5A is an equivalent circuit diagram of a configuration in which a third inductor is connected in parallel with a series resonator.
Figure 5B:
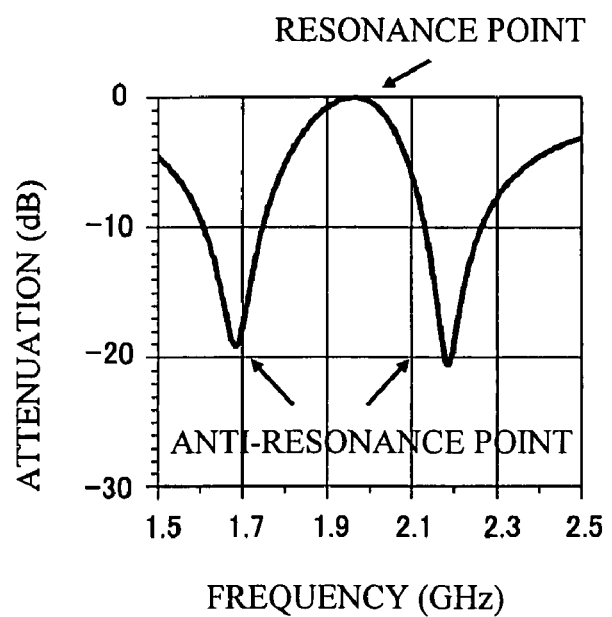
FIG. 5B is a graph of the bandpass characteristic of the configuration shown in FIG. 5A.
Figure 6A:
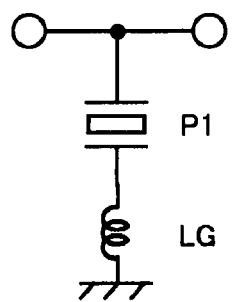
FIG. 6A is an equivalent circuit diagram of a configuration in which a fourth inductor is connected between a parallel resonator and ground.
Figure 6B:
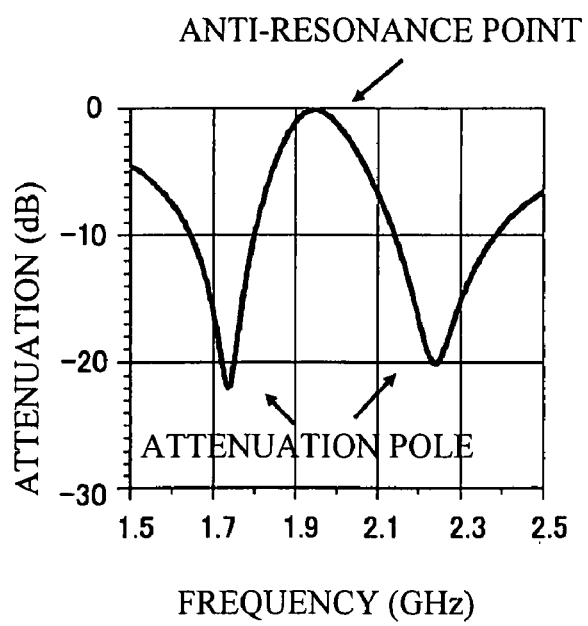
FIG. 6B is a graph of the bandpass characteristic of the configuration shown in FIG. 6A.

FIGS. 5A and 5B show the functions of the third inductors LT1 and LT2 of the first and second filters 10 and 20. The third inductor LT connected in parallel with the series resonator S1 shown in FIG. 5A forms anti-resonance points on both sides of the peak of the resonance point, as shown in FIG. 5B. FIGS. 6A and 6B show the functions of the fourth inductors LG1 and LG2 of the first and second filters 10 and 20. The fourth inductor LG connected in series to the parallel resonator P1 form attenuation poles on both sides of the peak of the anti-resonance point, as shown in FIG. 6B. The use of both the third inductor LT and the fourth inductor LG makes it possible to overlap the anti-resonance points shown in FIG. 5B and the attenuation poles shown in FIG. 6B with each other. It is thus possible to realize a large attenuation in the other band and improved suppression in the other band.

Figure 7:
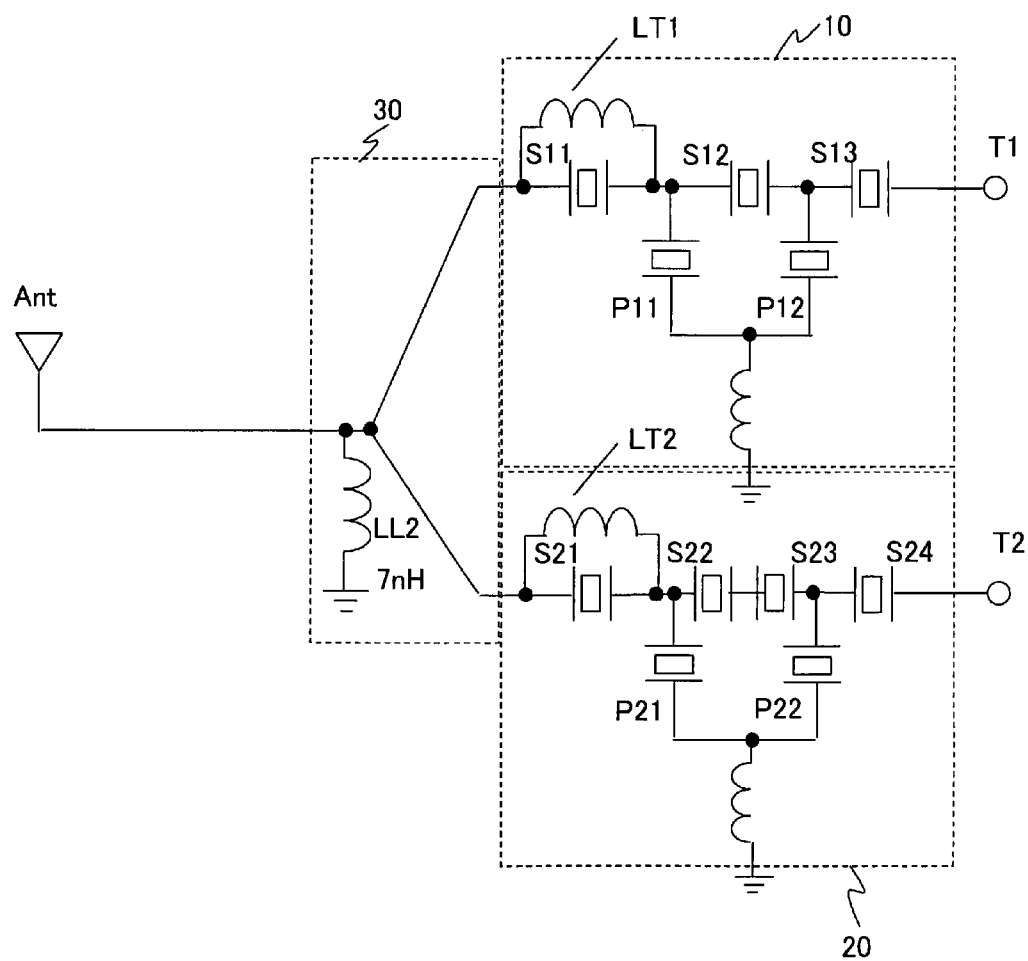
FIG. 7 is an equivalent circuit diagram of a comparative example.

FIG. 7 is an equivalent circuit of a duplexer of a comparative example. This duplexer does not have the resonance circuit 40. The matching circuit 30 includes the second inductor LL2 having an inductance of 7 nH.

Figure 8A:
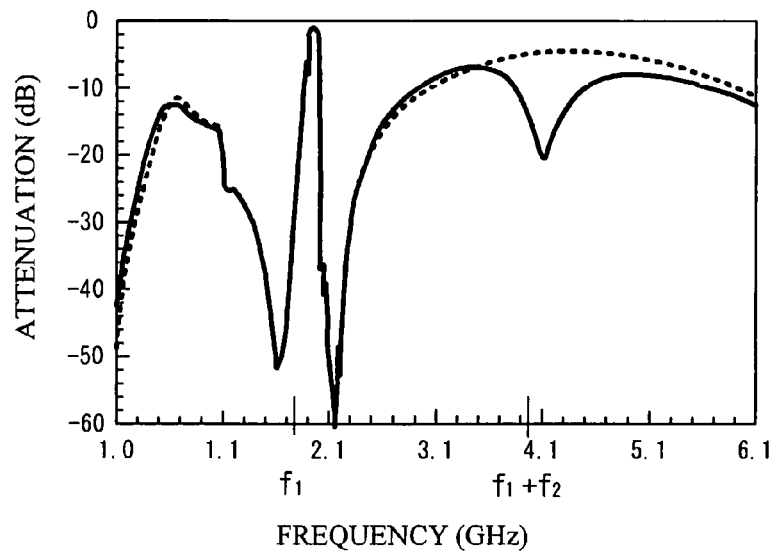
FIG. 8A is a graph of the bandpass characteristics of the first filters of the first embodiment and the comparative example.
Figure 8B:
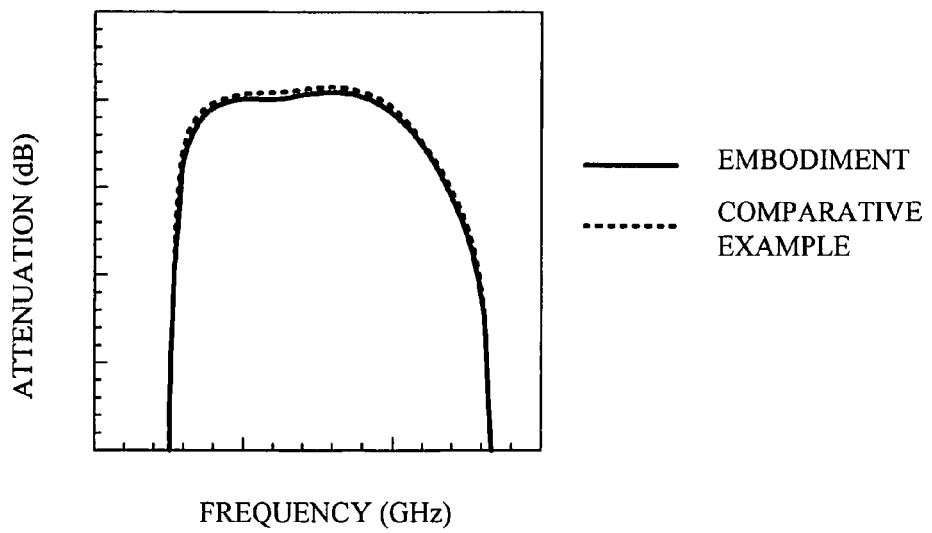
FIG. 8B is an enlarged view of the passbands.
Figure 9A:
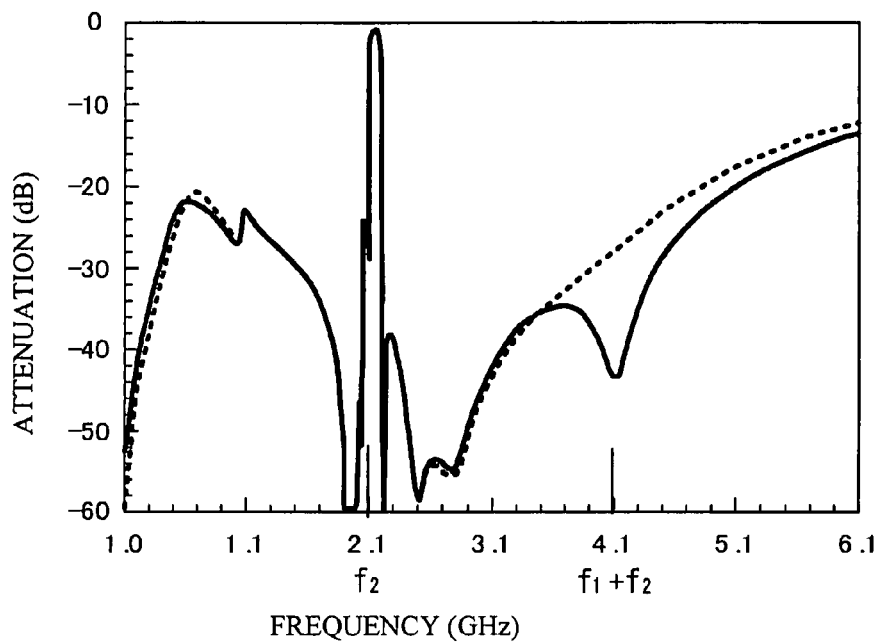
FIG. 9A is a graph of the bandpass characteristics of the second filters of the first embodiment and the comparative example.
Figure 9B:
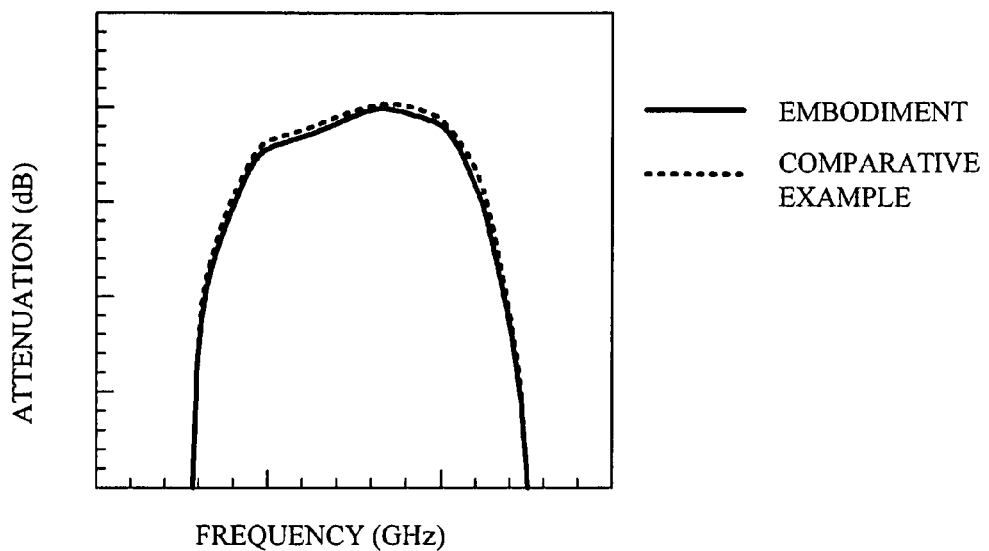
FIG. 9B is an enlarged view of the passbands.

FIG. 8A is a graph of the passband characteristics of the first filters 10 employed in the duplexers in accordance with the first embodiment and the comparative example, and FIG. 8B is an enlarged view of the passbands (transmission bands) of the first filters 10 thereof. FIG. 9A is a graph of the passband characteristics of the second filters 20 employed in the duplexers in accordance with the first embodiment and the comparative example, and FIG. 9B is an enlarged view of the passbands (reception bands) of the second filters 20. It can be seen from FIGS. 8A and 9A that the resonance circuit 40 of the first embodiment has a large attenuation at the resonance frequency of the resonance circuit 40 (the frequency of the disturbance wave). It can be seen from FIGS. 8B and 9B that the first embodiment and the comparative example have almost the same bandpass characteristics in the passband. According to the first embodiment, a large attenuation is available at the frequency of the disturbance wave without substantial loss in the passband.

The increased attenuation at the frequency of the disturbance wave of $f_a+f_b$ corresponds to a decrease in $A_2$ in Expression 1. Thus, since $E_1=E_2=bA_1A_2$, E1 and E2 decrease. Thus, the term $\{E_1 \cos(2\pi(f_1-f_2)\cdot t)+E_2 \cos(2\pi f(f_1+f_2)\cdot t)\}$ in Expression 2 becomes small. This means that the IMD level can be reduced. FIG. 10A shows the above fact. When the disturbance wave has frequencies of $f_2-f_1$ and $f_2+f_1$, the IMD levels E1 and E2 are proportional to $A_1\cdot A_2$, so that A2 is decreased from A2″ to A2′ and the IMD levels are decreased. As shown in FIG. 10B, when the disturbance wave has frequencies of $2f_1-f_2$ and $2f_1+f_2$, the IMD levels F1 and F2 are proportional to $A_1^2\cdot A_2$, so that A2 is decreased from A2″ to A2′ and the IMD levels are decreased. As described above, the IMD of the duplexer can be improved by increasing the attenuation at the frequencies of the disturbance wave.

In accordance with the first embodiment, assuming that the passband frequency of the first filter 10 ranges from $f_{1Low}$ to $f_{1High}$ ($f_{1Low}$~$f_{1High}$) and the passband frequency ranges from $f_{2Low}$ to $f_{2High}$ ($f_{2Low}$~$f_{2High}$), the range of the resonance frequency $f_r$ of the resonator 40 is set so that:

$$f_r=(f_{2Low}\text{~}f_{2High})\pm(f_{1Low}\text{~}f_{1High}), \text{ or}$$

$$f_r=2(f_{1Low}\text{~}f_{1High})\pm(f_{2Low}\text{~}f_{2High})$$

It is thus possible to increase the attenuation at the frequencies of the disturbance wave and to suppress occurrence of non-linearity arising from the disturbance wave. This makes it possible to restrain unnecessary components resulting from the non-linearity from passing through the second filter 20 and being noise.

The resonance frequency $f_r$ of the resonance circuit 40 may be set at a frequency equal to that of the second or third overtone wave of the first or second filter 10 or 20. That is, the following setting may be used: $f_r=2(f_{1Low}\text{~}f_{1High})$, $f_r=2(f_{2Low}\text{~}f_{2High})$, $f_r=3(f_{1Low}\text{~}f_{1High})$, or $f_r=3(f_{2Low}\text{~}f_{2High})$.

Figure 11:
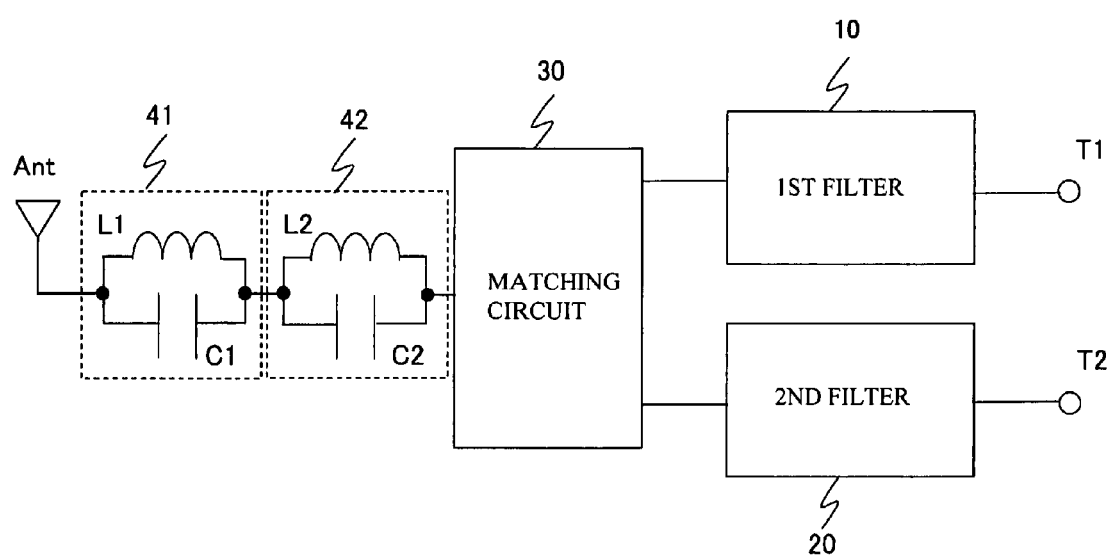
FIG. 11 shows an exemplary duplexer having two resonance circuits.
Figure 12A:
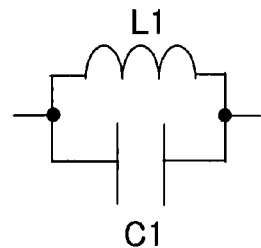
FIGS. 12A through 12G show exemplary configurations of the resonance circuit.
Figure 12B:
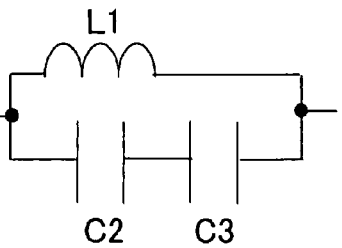
Figure 12C:
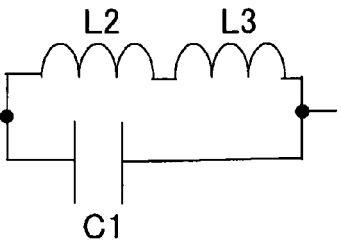
Figure 12D:
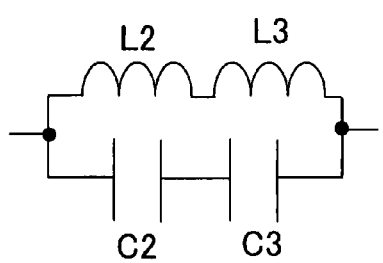
Figure 12E:
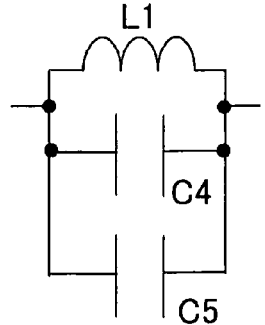
Figure 12F:
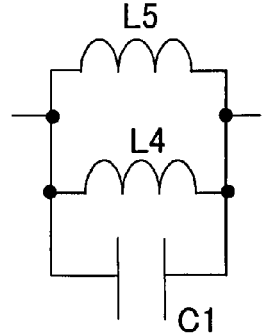
Figure 12G:
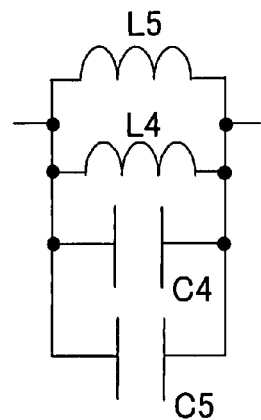

The first embodiment is not limited to the use of the single resonance circuit 40. As shown in FIG. 11, two resonance circuits 41 and 42 or more may be provided to further attenuate the frequencies of the multiple disturbance waves.

The resonator 40 may be configured as shown in any of FIGS. 12A through 12G in which at least one first inductor and at least one first capacitor are connected in parallel in order to increase the frequency of the disturbance wave.

Figure 13:
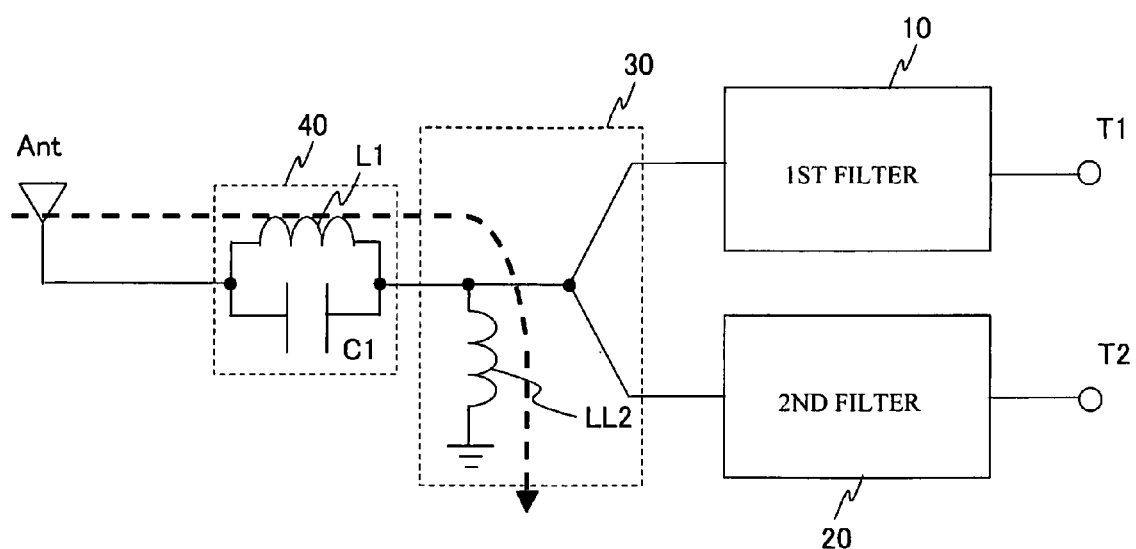
FIG. 13 shows a function of the second inductor.

Further, the second inductor LL2 connected to ground is connected to a node between the resonance circuit 40 and the first and second filters 10 and 20. As shown by an arrow in FIG. 13, the disturbance waves close to DC pass through the second inductor LL2 and flow to ground. The disturbance waves of high frequencies are attenuated by the resonance circuit 40, while the disturbance waves of low frequencies are attenuated by the second inductor LL2. It is thus possible to improve the linearity of the duplexer.

Figure 14:
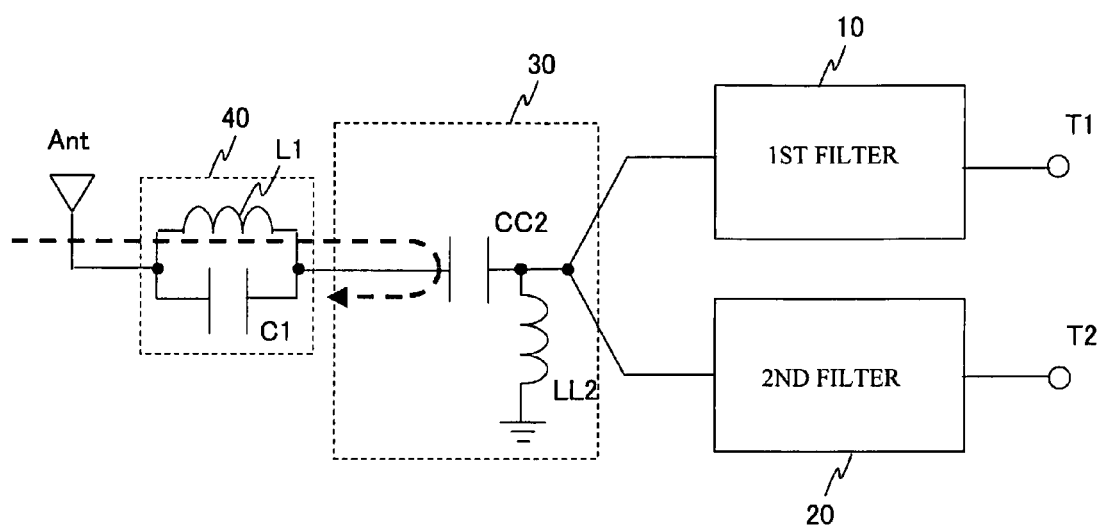
FIG. 14 shows a configuration in which a second capacitor is provided in a matching circuit.

Furthermore, as shown in FIG. 14, a second capacitor CC2 may be provided between the resonance circuit 40 and the first and second filters 10 and 20. As indicated by an arrow in FIG. 14, the disturbance waves of frequencies close to DC are blocked by the second capacitor CC2. It is thus possible to improve the linearity of the duplexer.

The first filter 10 and the second filer 20 are not limited to the ladder configuration, but may be of another type. At least one of the first filter 10 and the second filter 20 may have the ladder configuration, in which the third inductor may be connected in parallel with the series resonator of the ladder-type filter. The fourth inductor may be provided between the parallel resonators and ground. With these structures, the other passband can be suppressed well, as shown in FIGS. 5B and 6B. The third inductor LT or the fourth inductor LG may degrade attenuation over the wide range. This may degrade the non-linear response arising from the disturbance wave. The resonance circuit 40 is capable of improving the suppression of the other band and the non-linearity.

The third inductor LT may be connected to any of the series resonators. Preferably, the third inductors LT are connected in parallel with the series resonator S11 and S21 closest to the antenna terminal Ant. The third inductors may function as a matching circuit, so that the regular matching circuit 30 can be simplified. The fourth inductor LG may be provided for each of the parallel resonators. Preferably, the fourth inductor LG is connected between the common node of the parallel resonators and ground. The fourth inductor LG may have a large inductance, which leads to a large size. However, the fourth inductor LG provided commonly for the parallel resonators realize downsized duplexers.

At least one of the first filter 10 and the second filter 20 may have a ladder configuration, so that the insertion loss and attenuation can easily be designed by adding an external capacitor to the duplexer, selecting the number of stages, and adjusting the capacitance values of the resonators.

Second Embodiment

Figure 15:
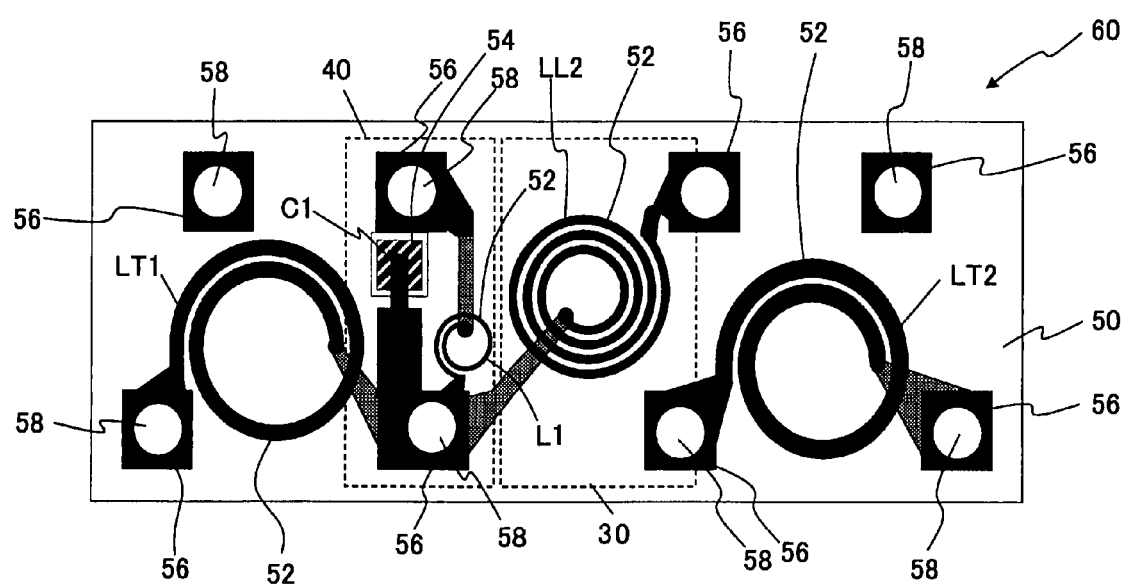
FIG. 15A is a plan view of an integrated passive element chip.
FIG. 15B is a schematic cross-sectional view of an MIM capacitor.
Figure 16:
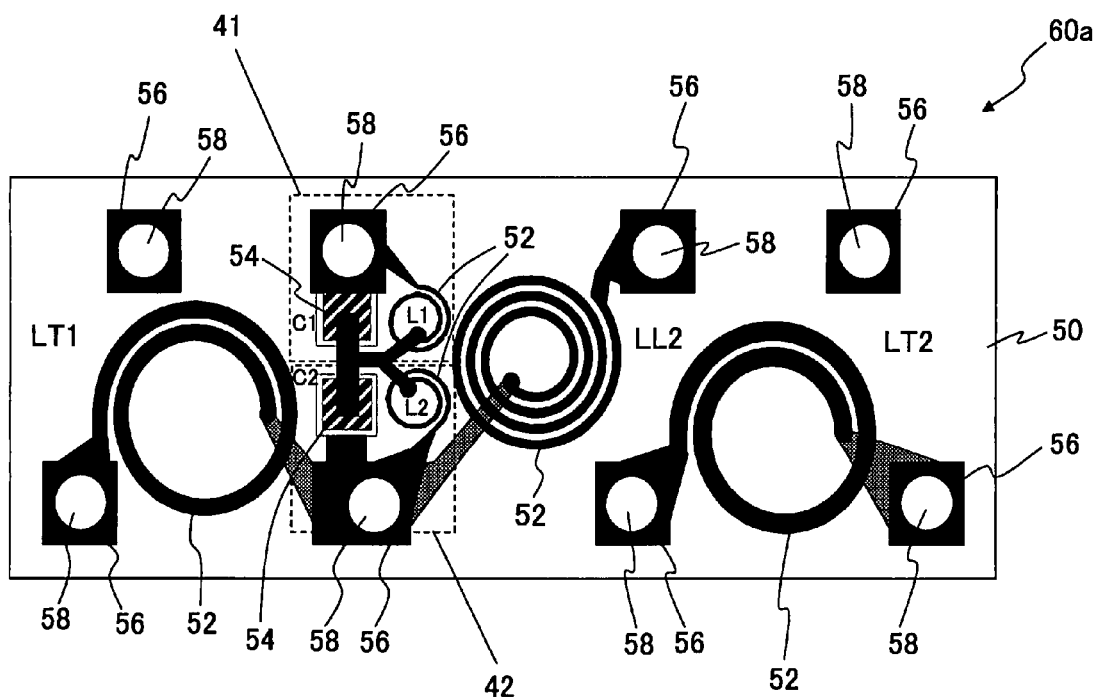
FIG. 16 is a plan view of an integrated passive element chip of the duplexer shown in FIG. 11.

A second embodiment has an exemplary packaged duplexer having the circuit configuration of the first embodiment. FIG. 15A is a plan view of an integrated passive component chip 60 having a substrate 50 made of fused quartz on which the resonator circuit 40, the matching circuit 30, the third inductors LT1 and LT2 are formed. Spiral inductors formed by metal wires formed on the substrate 50 define the first inductors L1, the second inductors LL2 and the third inductors LT1 and LT2. The metal wires may, for example, be copper wires. FIG. 15B is a cross-sectional view of the first capacitor C1. The first capacitor C1 is formed by an MIM capacitor 54 composed of a lower electrode on the substrate 50, a dielectric film 64 such as a silicon nitride film, and an upper electrode 66. The upper electrode 66 is connected to a pad 56 by an interconnection 68 made of copper or the like. As shown in FIG. 15A, the inductors and capacitors are connected to pads 56, which are connected to bumps 58 made of solder or gold. FIG. 16 is a plan view of an integrated passive element chip 60a equipped with two resonance circuits 41 and 42 shown in FIG. 11. In the resonance circuit 41, the first inductor L1 formed by a spiral inductor 52 and the first capacitor C1 formed by an MIM capacitor 54 are connected in parallel. In the resonance circuit 42, the first inductor L2 formed by a spiral inductor 52 and the first capacitor C2 formed by an MIM capacitor 54 are connected in parallel. The other structures are the same as those shown in FIG. 15A, and a description thereof will be omitted here.

Figure 17:
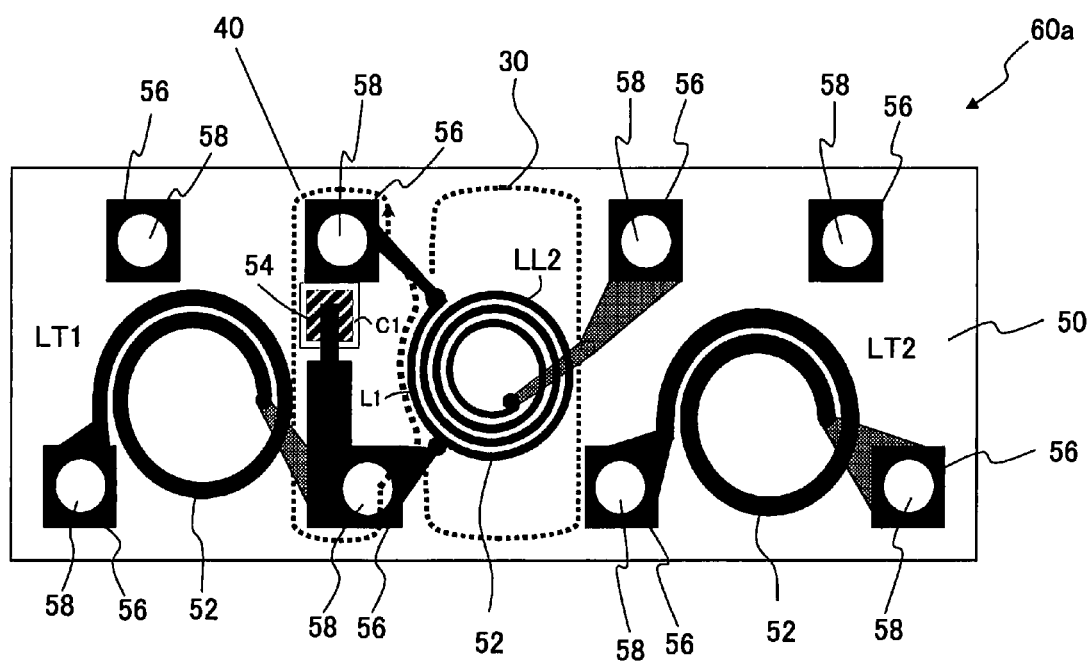
FIG. 17 is a plan view of another example of the integrated passive element chip.

FIG. 17 shows a device having a spiral inductor 52b having a part functioning as the first inductor L1 of the resonance circuit 40 and another part functioning as the second inductor LL2 of the matching circuit 30. The other structures of the device shown in FIG. 17 are the same as those shown in FIG. 15. The spiral inductor 52b does not need to provide the resonance circuit 40 and the matching circuit 30 with respective separate inductors, so that the chip can be downsized.

Figure 18:
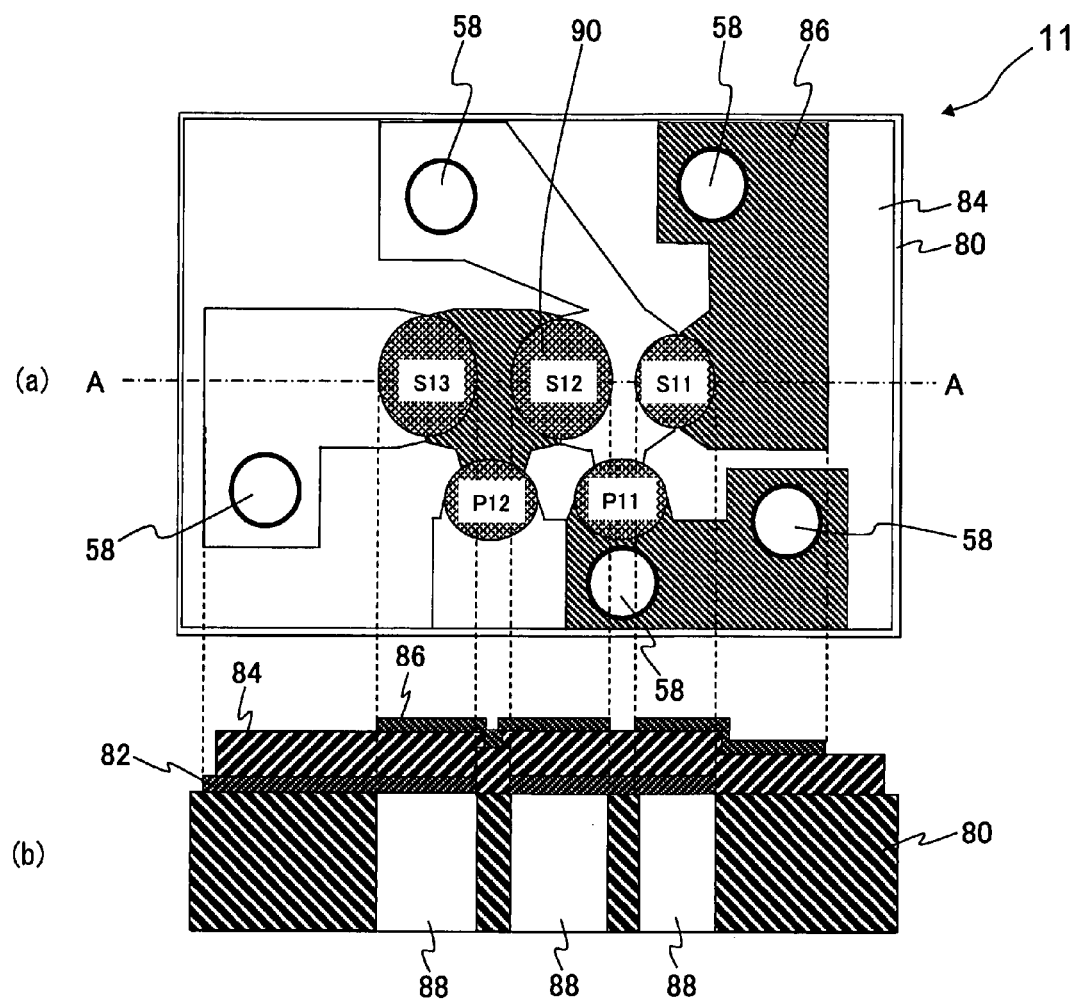
FIG. 18 shows a plan view (a) of a first filter chip, and a cross-sectional view (b) taken along a line A-A.

Part (a) of FIG. 18 is a plan view a first filter chip 11 that forms the first filter 10 in which the lower electrode 82 is shown through a piezoelectric film 84. Part (b) of FIG. 18 is a cross-sectional view taken along a line A-A shown in part (a) of FIG. 18. The resonators provided in the first filter chip 11 are FBARs (Film Bulk Acoustic Resonators) of BAW. The chip 11 has a substrate 80 made of, for example, silicon on which a lower electrode 82, the piezoelectric film 84 and an upper electrode 86 are laminated in this order. The lower electrode 82 may be made of, for example, ruthenium (Ru). Similarly, the upper electrode 86 may be made of, for example, Ru. The piezoelectric film 84 may be made of, for example, aluminum nitride (AlN). The piezoelectric film 84 are sandwiched between the lower electrode 82 and the upper electrode 86. An overlapping region 90 in which the upper electrode 86 overlaps with the lower electrode 82 across the piezoelectric film 84 is a resonance section. A cavity 88 is formed in the substrate 80 and is located below each overlapping region (resonance section) 90. The first filter chip 11 has series resonators S11 through S13 and parallel resonators P11 and P12. Bumps 58 are formed on pads formed by the upper electrodes 86 and lower electrodes 82.

Figure 19:
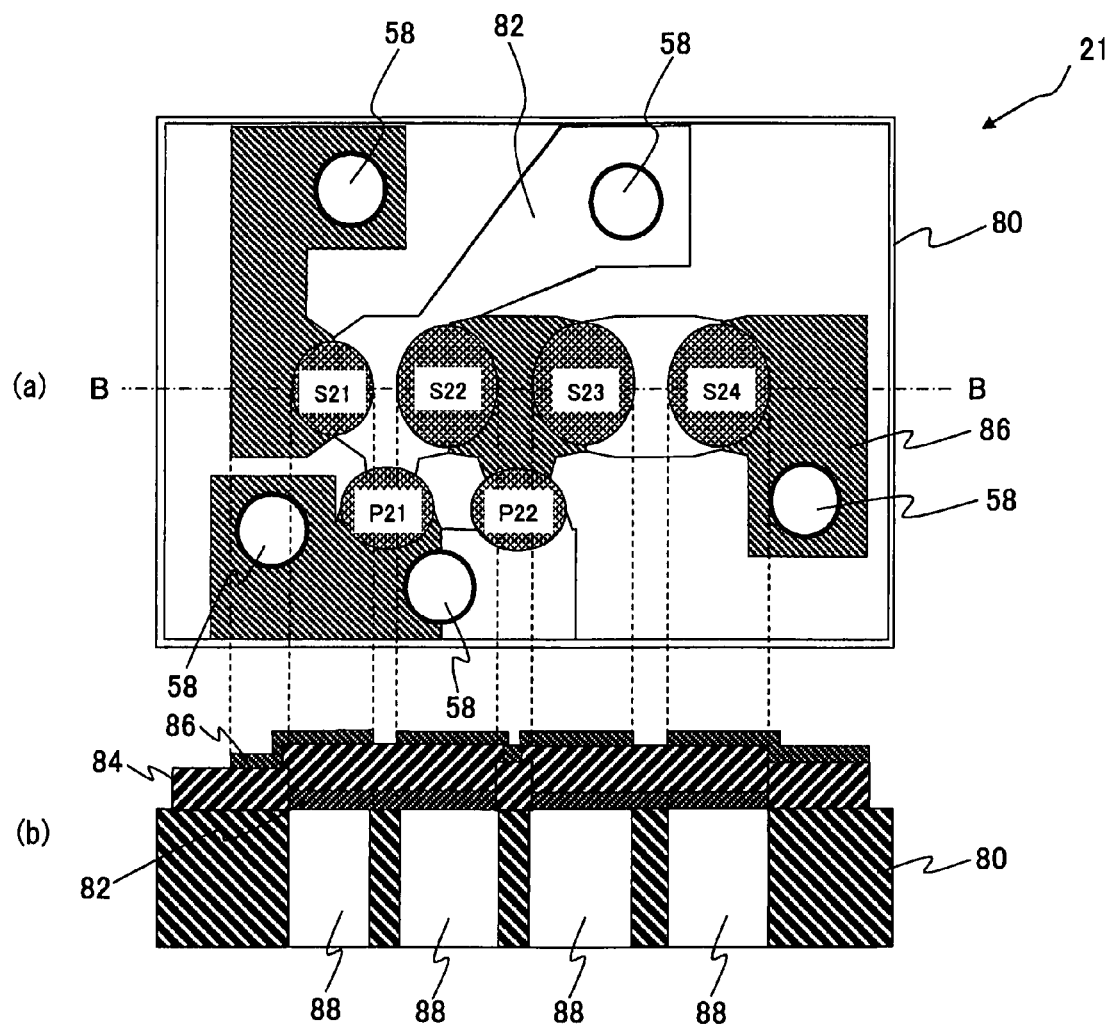
FIG. 19A shows a plan view (a) of a second filter chip, and a cross-sectional view (b) taken along a line B-B shown in part (a) of FIG. 19.

Part (a) of FIG. 19A is a plan view of a second filter chip 21 that forms the second filter 20, and part (b) of FIG. 19 is a cross-sectional view taken along a line B-B shown in part (a). Like the first filter chip 11, the second filter chip 21 has series resonators S21 through S24 and parallel resonators P21 and P22. The passband frequencies of the first filer 10 and the second filter 20 are determined by the thickness of the piezoelectric film 84. The first filter chip 11 and the second filter chip 21 have different thickness values of the piezoelectric film 84.

Figure 20A:
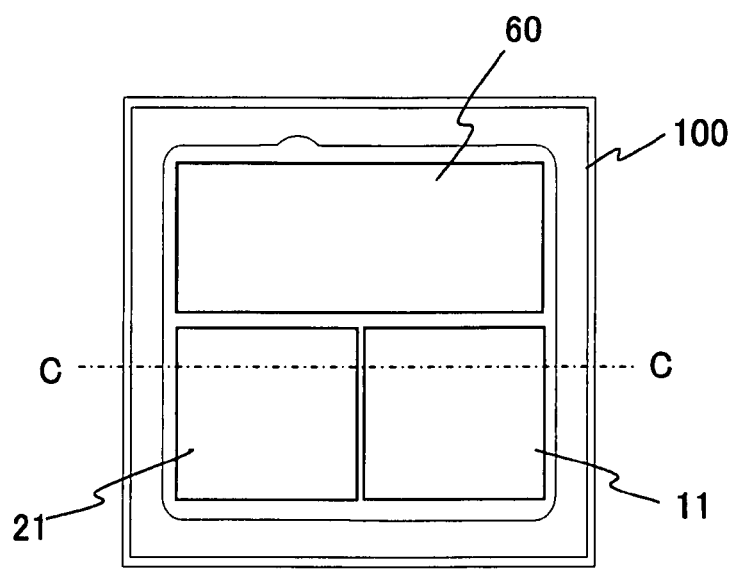
FIG. 20A is a plan view of a second embodiment.
Figure 20B:
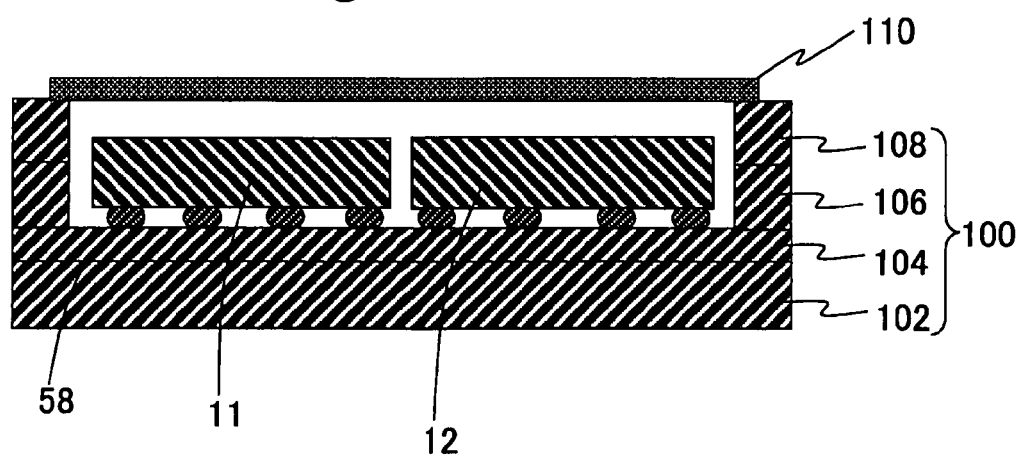
FIG. 20B is a cross-sectional view taken along a line C-C shown in FIG. 20A.

FIGS. 20A and 20B show a package 100 in which a duplexer is mounted. FIG. 20A shows the package 100 from which a cap 110 has been removed. The integrated passive element chip 60, the first filter chip 11 and the second filter chip 21 are facedown mounted on the surface of a die attach layer 104 of the package 100. As shown in FIG. 20B, the package 100 is composed of a base layer 102, the die attach layer 104, a cavity layer 106, and a cap mount layer 108, each of which layers is made of ceramic. The bumps 58 are used to mount the integrated passive element chip 60, the first filter chip 11 and the second filter chip 21 on the surface of the die attach layer. An electrically conductive cap 110 is mounted on the cap mount layer 108.

Figure 21A:
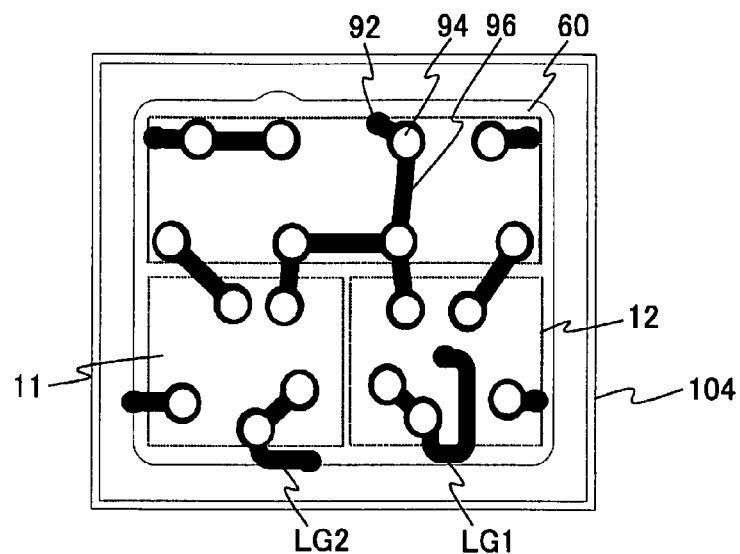
FIGS. 21A, 21B and 21C show layers of a package.
Figure 21B:
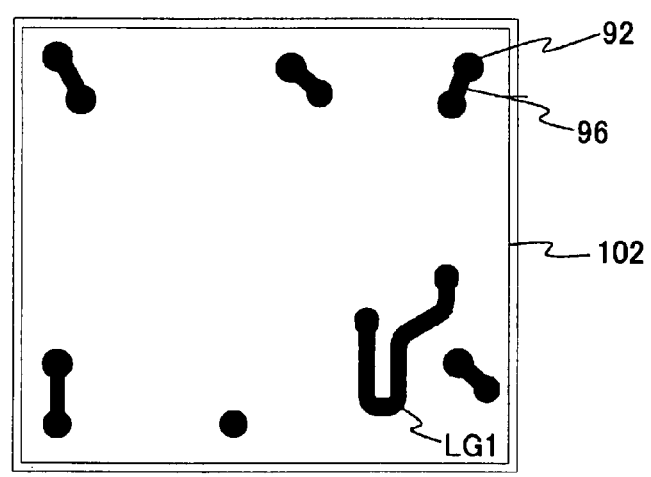
Figure 21C:
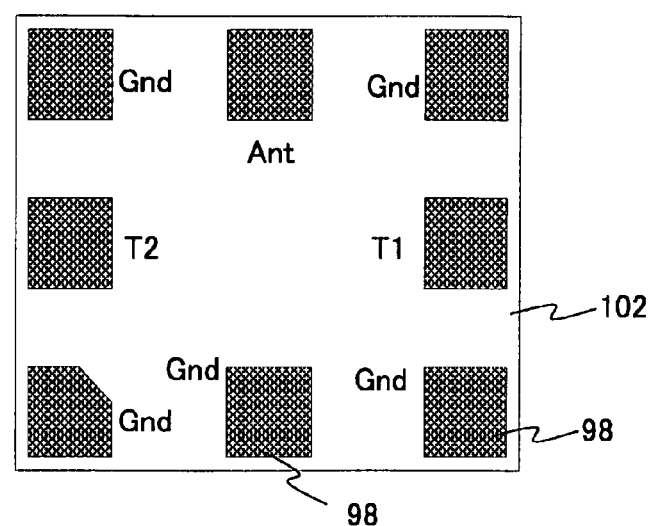

FIG. 21A shows the front surface of the die attach layer 104, FIG. 21A shows the front surface of the base layer 102, and FIG. 21C shows the back surface of the base layer 102 transparently viewed from the front side thereof. In FIG. 21A, dotted lines define regions in which the integrated passive element chip 60, the first filter chip 11 and the second filter chip 21 are respectively mounted on the front surface of the die attach layer 104. On the front surface of the die attach layer 104, formed are electrically conductive patterns such as bump pads 94, line patterns 96, and vias 92 full of an electrically conductive material. The bump pads 94 are connected to bumps of chips 60, 11 and 21. The line patterns 96 are patterns for making connections with the bump pads 94 and vias 92. The line patterns 96 also function as the fourth inductors LG1 and LG2. The vias 92 are penetrated through the die attach layer 104 or the base layer 102 and are filled with the electrically conductive material, and make connections between the layers.

As shown in FIG. 21B, the vias 92 and the line patterns 96 are formed on the surface of the base layer 102. As shown in FIG. 21C, on the back surface of the base layer 102, there are provided the antenna terminal Ant, the first terminal T1, the second terminal T2, and electrically conductive foot pads 98 functioning as ground terminals Gnd.

According to the second embodiment, the duplexer of the first embodiment is packaged. As shown in FIG. 14, the spiral inductor 52 and the MIM capacitor 54 formed on the same chip are used to form the first inductor L1 and the second capacitor C1 of the resonance circuit 40. Thus, the first inductor L1 and the second capacitor C1 can be spaced apart from other wiring lines, so that the electromagnetic loss can be reduced and a higher Q value can be obtained.

In addition to the resonance circuit 40, the matching circuit 30 having the second inductor LL2 and/or the second capacitor CC2 may be formed by lumped-constant elements such as the spiral inductor 52 and the MIM capacitor 54. It is thus possible to use a high-Q inductor and a high-Q capacitor and to reduce the loss of the matching circuit 30.

The aforementioned embodiments are exemplary devices having piezoelectric thin-film resonators that form the first filter 10 and the second filter 20. By way of another example, at least one of the first filter 10 and the second filter 20 may be formed by surface acoustic wave resonators or boundary acoustic wave resonators.

The resonators of the first filter 10, the resonators of the second filter 20 and the resonance circuit 40 are formed on the chips 11, 21 and 60 and are facedown mounted on the package 100. This arrangement does not need pads for wires on the package 100 and enables downsizing.

The present invention is not limited to the specifically disclosed embodiments, but other embodiments and variations may be made without departing from the scope of the present invention.

The present invention is based on Japanese Patent Application No. 2006-169274 filed Jun. 19, 2006, the entire disclosure of which is hereby incorporated by reference.

What is claimed is:

1. A duplexer comprising:
an antenna terminal;
   a first filter connected to the antenna terminal;
   a second filter that has a passband at a high-frequency side of the first filter and is connected to the antenna terminal; and
   a resonance circuit that is connected between the second filter and the antenna terminal and includes a first inductor and a first capacitor connected in parallel;
   assuming that a passband frequency of the first filter ranges from $f_{1Low}$ to $f_{1High}$ ($f_{1Low} \sim f_{1High}$) and a passband frequency of the second filter ranges from $f_{2Low}$ to $f_{2High}$ ($f_{2Low} \sim f_{2High}$), the resonance circuit having a resonance frequency $f_r$ satisfying:

$$f_r = (f_{2Low} \sim f_{2High}) \pm (f_{1Low} \sim f_{1High}), \text{ or}$$

$$f_r = 2(f_{1Low} \sim f_{1High}) \pm (f_{2Low} \sim f_{2High}),$$

wherein at least one of the first filter and the second filter is a ladder type filter, and has a parallel resonator, a fourth inductor being provided between the parallel resonator and ground.

2. A duplexer comprising:
an antenna terminal;
   a first filter connected to the antenna terminal;
   a second filter that has a passband at a high-frequency side of the first filter and is connected to the antenna terminal; and
   a resonance circuit that is connected between the second filter and the antenna terminal and includes a first inductor and a first capacitor connected in parallel;
   assuming that a passband frequency of the first filter ranges from $f_{1Low}$ to $f_{1High}$ ($f_{1Low} \sim f_{1High}$) and a passband frequency of the second filter ranges from $f_{2Low}$ to $f_{2High}$ ($f_{2Low} \sim f_{2High}$), the resonance circuit having a resonance frequency $f_r$ satisfying:

$$f_r = 2(f_{1Low} \sim f_{1High}), f_r = 2(f_{2Low} \sim f_{2High}), f_r = 3(f_{1Low} \sim f_{1High}), \text{ or}$$

$$f_r = 3(f_{2Low} \sim f_{2High}),$$

wherein at least one of the first filter and the second filter is a ladder type filter, and has a parallel resonator, a fourth inductor being provided between the parallel resonator and ground.

3. The duplexer as claimed in claim 1, further comprising a second inductor that is provided between the resonance circuit and the second filter, the second inductor being connected to ground.

4. The duplexer as claimed in claim 1, further comprising a second capacitor connected in series between the resonance circuit and the second filter.

5. A duplexer comprising:
an antenna terminal;
   a first filter connected to the antenna terminal;
   a second filter that has a passband at a high-frequency side of the first filter and is connected to the antenna terminal; and
   a resonance circuit that is connected between the second filter and the antenna terminal and includes a first inductor and a first capacitor connected in parallel;
   assuming that a passband frequency of the first filter ranges from $f_{1Low}$ to $f_{1High}$ ($f_{1Low} \sim f_{1High}$) and a passband frequency of the second filter ranges from $f_{2Low}$ to $f_{2High}$ ($f_{2Low} \sim f_{2High}$), the resonance circuit having a resonance frequency $f_r$ satisfying:

$$f_r = (f_{2Low} \sim f_{2High}) \pm (f_{1Low} \sim f_{1High}), \text{ or}$$

$$f_r = 2(f_{1Low} \sim f_{1High}) \pm (f_{2Low} \sim f_{2High}),$$

wherein at least one of the first filter and the second filter is a ladder type filter, and has a series resonator with which a third inductor is connected in parallel.

6. The duplexer as claimed in claim 1, wherein the first inductor and the first capacitor are formed on an identical chip.

7. The duplexer as claimed in claim 3, further comprising a second capacitor connected in series between the resonance circuit and the second filter, wherein the resonance circuit and at least one of the second inductor and the second capacitor are formed on an identical chip.

8. The duplexer as claimed in claim 1, wherein at least one of the first filter and the second filter is a ladder-type filter.

9. The duplexer as claimed in claim 1, wherein at least one of the first filter and the second filter includes one of a piezoelectric thin-film resonator, a surface acoustic wave resonator and a boundary acoustic wave filter.

10. A duplexer comprising:
an antenna terminal;
   a first filter connected to the antenna terminal;
   a second filter that has a passband at a high-frequency side of the first filter and is connected to the antenna terminal; and
   a resonance circuit that is connected between the second filter and the antenna terminal and includes a first inductor and a first capacitor connected in parallel;
   assuming that a passband frequency of the first filter ranges from $f_{1Low}$ to $f_{1High}$ ($f_{1Low} \sim f_{1High}$) and a passband frequency of the second filter ranges from $f_{2Low}$ to $f_{2High}$ ($f_{2Low} \sim f_{2High}$), the resonance circuit having a resonance frequency $f_r$ satisfying:

$$f_r = (f_{2Low} \sim f_{2High}) \pm (f_{1Low} \sim f_{1High}), \text{ or}$$

$$f_r = 2(f_{1Low} \sim f_{1High}) \pm (f_{2Low} \sim f_{2High}),$$

wherein resonators of the first filter, resonators of the second filter, and the resonance circuit are formed on a chip and are facedown mounted.

* * * * *